(12) United States Patent
Furukawa et al.

(10) Patent No.: US 7,217,604 B2
(45) Date of Patent: May 15, 2007

(54) STRUCTURE AND METHOD FOR THIN BOX SOI DEVICE

(75) Inventors: Toshiharu Furukawa, Essex Junction, VT (US); Carl J. Radens, LaGrangeville, NY (US); William R. Tonti, Essex Junction, VT (US); Richard Q. Williams, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 188 days.

(21) Appl. No.: 10/906,014

(22) Filed: Jan. 31, 2005

(65) Prior Publication Data

US 2006/0172499 A1 Aug. 3, 2006

(51) Int. Cl.
*H01L 21/84* (2006.01)
(52) U.S. Cl. ............... 438/154; 438/164; 438/294; 438/295; 438/296; 438/405; 438/411; 438/424; 257/E21.435
(58) Field of Classification Search ........... 438/154, 438/164, 294–296, 405, 411, 424; 257/E21.435
See application file for complete search history.

(56) References Cited

U.S. PATENT DOCUMENTS

| | | | |
|---|---|---|---|
| 5,665,613 A | 9/1997 | Nakashima et al. | |
| 5,780,900 A | 7/1998 | Suzuki et al. | |
| 6,180,487 B1 | 1/2001 | Lin | |
| 6,342,421 B1* | 1/2002 | Mitani et al. | 438/300 |
| 6,531,741 B1 | 3/2003 | Hargrove et al. | |
| 6,599,789 B1* | 7/2003 | Abbott et al. | 438/161 |
| 7,109,549 B2* | 9/2006 | Ozawa | 257/315 |

* cited by examiner

*Primary Examiner*—Matthew Smith
*Assistant Examiner*—Thanh V. Pham
(74) *Attorney, Agent, or Firm*—Schmeiser, Olsen, Watts; Anthony J. Canale (57) ABSTRACT

A method of forming a semiconductor device, including providing a substrate having a first insulative layer on a surface of the substrate, and a device layer on a surface of the first insulative layer, forming a spacer around the first insulative layer and the device layer, removing a portion of the substrate adjacent to the first insulative layer in a first region and a non-adjacent second region of the substrate, such that an opening is formed in the first and second regions of the substrate, leaving the substrate adjacent to the first insulative layer in a third region of the substrate, filling the opening within the first and second regions of the substrate, planarizing a surface of the device, and forming a device within the device layer, such that diffusion regions of the device are formed within the device layer above the first and second regions of the substrate, and a channel region of the device is formed above the third region of the substrate.

14 Claims, 9 Drawing Sheets

STRUCTURE AND METHOD FOR THIN BOX SOI DEVICE

BACKGROUND OF THE INVENTION

1. Technical Field

The present invention relates generally to semiconductor devices, and more particularly, to a method of forming a silicon-on-insulator (SOI) device having a buried oxide (BOX) layer, and the structure so formed.

2. Related Art

Conventionally silicon-on-insulator (SOI) devices are formed having a buried oxide layer (BOX) under the active regions of a field effect transistor (e.g., a MOSFET device). The BOX layer, which is conventionally made uniformly thin under the active area of the device, produces a faster MOSFET device for several reasons. First, the BOX layer reduces the capacitance between the source/drain regions and the substrate of the device. Second, the channel region, between the source/drain regions, becomes decoupled from the substrate allowing movement, or "floating" of the channel region potential with respect to the substrate. For example, when the channel region potential floats positive, the threshold voltage drops, thereby increasing the drive current.

One of the difficulties typically encountered with this type of device, however, is determining the optimal BOX layer thickness. The capacitance between the source/drain region and the substrate increases as the thickness of the BOX layer is decreased, increasing the circuit loading. The amount of channel region potential "floating" also increases with increasing thickness of the BOX layer due to the reduced capacitance coupling to the substrate. Unfortunately, a floating channel region has the undesirable effect of producing a fluctuating threshold voltage, and therefore, an unpredictable device.

Therefore, there is a need in the industry for a method of forming a semiconductor device that addresses these and other problems.

SUMMARY OF THE INVENTION

The present invention provides a method of forming a semiconductor device having a thin insulator region beneath a channel region of the device and a thick insulator region beneath the source/drain regions of the device, therefore solving the above-stated and other problems.

A first aspect of the invention provides a method of forming a semiconductor device, comprising: providing a substrate having a first insulative layer on a surface of the substrate, and a device layer on a surface of the first insulative layer; forming an opening within the substrate in direct mechanical contact with the first insulative layer in a first region and a second region of the device, wherein the second region of the device is not adjacent to the first region, leaving the substrate in direct mechanical contact with the first insulative layer in a third region of the device; depositing a second insulative layer over a surface of the device, filling the opening within the substrate in the first and second regions of the device, such that a thickness of the first insulative layer and the second insulative layer within the first and second regions of the device is greater than a thickness of the first insulative layer within the third region of the device; planarizing a surface of the device to remove excess insulative material; and forming the active region of the device within the device layer.

A second aspect of the invention provides a method of forming a semiconductor device, comprising: providing a substrate having a first insulative layer on a surface of the substrate, and a device layer on a surface of the first insulative layer; forming an opening within the substrate that undercuts the first insulative layer in a first region and a second region of the device, leaving the substrate beneath the first insulative layer in a third region of the device, wherein the first insulative layer within the third region forms a thin insulator region; depositing a second insulative layer within the opening within the substrate in the first and second regions of the device to form a thick insulator region; and forming an active region of the device within the device layer.

A third aspect of the invention provides a semiconductor device, comprising: a substrate; an insulative material on a surface of the substrate, wherein a thickness of the insulative material in a first region and a second region of the device is greater than a thickness of the insulative material in a third region of the device, wherein the first region of the device is non-adjacent to the second region of the device, and wherein the insulative material in the first, second and third regions of the device share a substantially co-planar surface; and a device layer on the substantially co-planar surface of the insulative material above the first, second and third regions of the device having an active region therein.

The foregoing and other features and advantages of the invention will be apparent from the following more particular description of the embodiments of the invention.

BRIEF DESCRIPTION OF THE DRAWINGS

The embodiments of this invention will be described in detail, with reference to the following figures, wherein like designations denote like elements, and wherein.

DESCRIPTION OF THE PREFERRED EMBODIMENTS

Although certain embodiments of the present invention will be shown and described in detail, it should be understood that various changes and modifications might be made without departing from the scope of the appended claims. The scope of the present invention will in no way be limited to the number of constituting components, the materials thereof, the shapes thereof, the relative arrangement thereof, etc. Although the drawings are intended to illustrate the present invention, the drawings are not necessarily drawn to scale.

Figure 1:
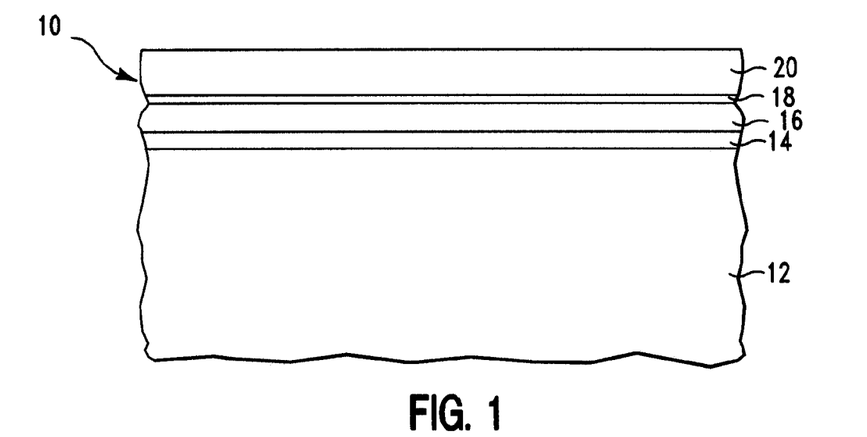
FIG. 1 depicts a cross-sectional view of a device comprising a substrate, a buried oxide layer, a silicon-on-oxide layer, and two protective layers, in accordance with embodiments of the present invention.

FIG. 1 depicts a semiconductor device 10 comprising a substrate 12. The substrate 12 may comprise a semiconductor material, such as silicon, etc. A first insulative layer, or a "thin" buried oxide layer (BOX) 14 is formed over the surface of the substrate 12, wherein "thin" is defined as a layer having a thickness in the range of about 10–90 Å. The BOX layer 14 may be formed using ion implantation, often referred to as SIMOX (silicon implanted oxygen), wherein oxygen ions are implanted into the substrate, followed by a high temperature annealing process, as known in the art, to form silicon dioxide in the BOX layer 14 (assuming the substrate comprises silicon). Alternatively, the BOX layer 14 may be formed using a bonded wafer technique, wherein a thin layer of silicon dioxide ($SiO_2$) is formed on a first side of two silicon wafers. The first sides of the two wafers are then bonded together at a temperature in the range of about 250–350° C., or bonded using other methods as known in the art. Although it is desirable for the BOX layer 14 to be "thin", it is likewise desirable that the BOX layer 14 be thick enough to prevent direct tunneling, or other leakage currents between the active region (formed infra), and the substrate 12 through the BOX layer 14.

The BOX layer 14 provides decoupling of the MOSFET transistor, (formed infra), from the rest of the substrate 12. In common practice, this makes the device 10 that will be formed operate faster if the BOX layer 14 is thick for at least two reasons. First, the capacitance from source/drain regions, (formed infra), into the substrate 12 is essentially removed. Second, the channel region, (formed infra) between the source/drain region, is decoupled from the substrate 12, allowing the channel region potential to move, or "float".

The layer of substrate 12 above the BOX layer 14 forms a device layer 16. The combination of the BOX layer 14 and the device layer 16 forms a silicon-on-insulator (SOI) layer, as known in the art. For example, during the SIMOX process described supra, the oxygen ions are implanted beneath the surface of the silicon substrate 12, resulting in a layer of the silicon substrate above the BOX layer 14, which is the device layer 16. Alternatively, using the bonding method described supra, each of the bulk wafers comprise a layer of $SiO_2$ on a silicon wafer, therefore, when the $SiO_2$ sides of the two wafers are bonded together the silicon remains on each side, thereby resulting in a top device layer 16. The device layer 16, comprising silicon, may be formed having a thickness of about 100–1000 Å. A first and a second protective layer 18 and 20 are formed over the device layer 16. The first protective layer 18 may comprise a pad oxide having a thickness on the range of about 200 Å. The second protective layer 20 may comprise a pad silicon nitride having a thickness on the range of about 100–500 Å.

Figure 2:
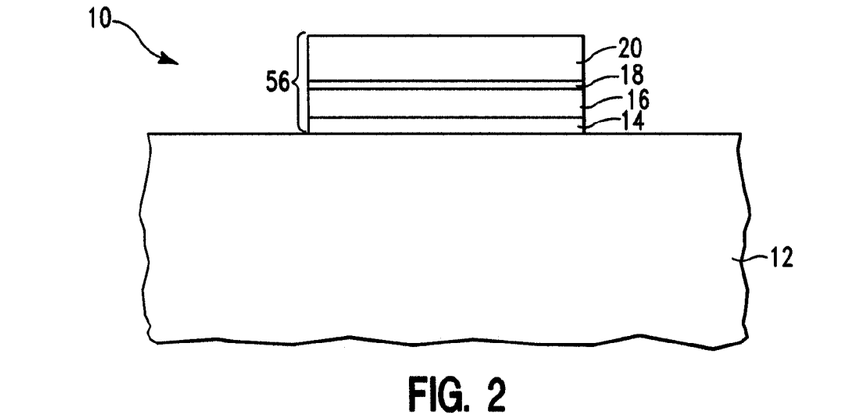
FIG. 2 depicts the device of FIG. 1 following patterning and etching.

A mask (not shown) is used to pattern the BOX layer 14, the device layer 16 and the protective layers 18, 20 using, for example, an active area mask, which defines where the gate stack and source/drain regions will be formed. The BOX layer 14, the device layer 16 and the protective layers 18, 20 are then etched, using multiple etch chemistries, down to the surface of the substrate 12, creating a location for the formation of an active region 56, hereinafter referred to simply as the "active region 56", in this example a transistor region, as illustrated in FIG. 2.

Figure 3:
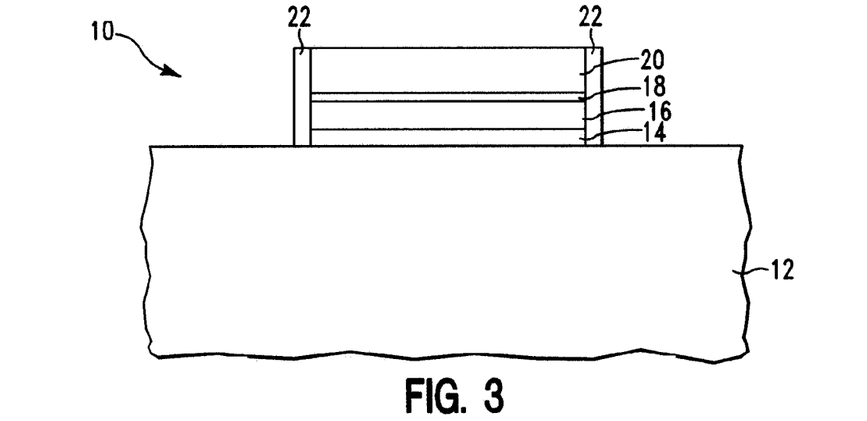
FIG. 3 depicts the device of FIG. 2 following spacer formation.

As illustrated in FIG. 3, a spacer 22 is formed around the active region 56. The spacer 22 is formed by first uniformly depositing a dielectric film, e.g., nitride or oxide, over the surface of the device 10 using conventional deposition techniques. An etch process, e.g., an anisotropic reactive ion etch, is performed to remove the excess film on the horizontal surfaces of the device 10, leaving the film on the vertical surfaces, or sides, of the BOX layer 14, the device layer 16 and the protective layers 18, 20. The spacer 22 may have a thickness on the order of 100–1000 Å.

Figure 4A:
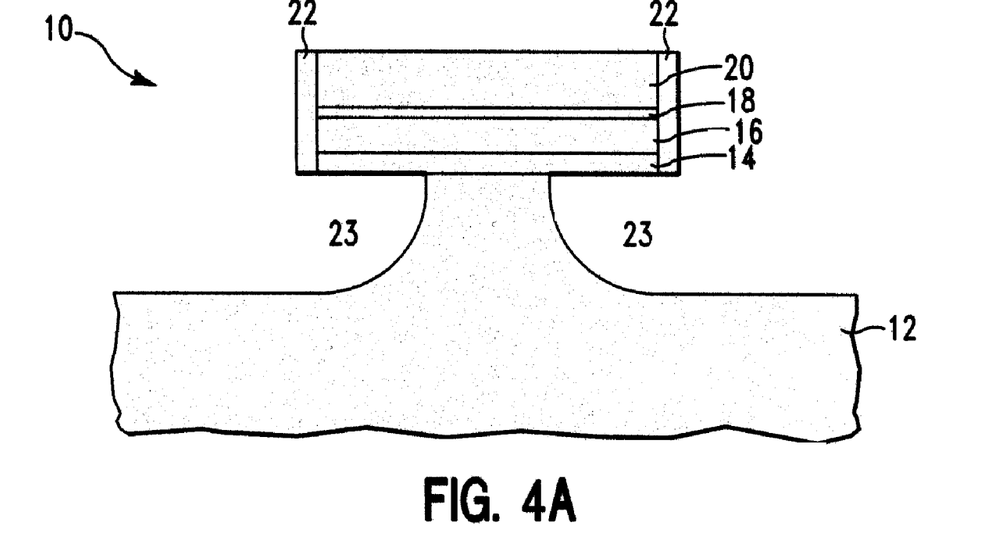
FIG. 4A depicts the device of FIG. 3 following an etch process.

An optional mask may be used to define the regions to be etched. A wet or dry isotropic etch process selective to silicon (within the substrate 12) is then performed, such that portions of the substrate 12 are removed creating openings 23, as illustrated in FIG. 4A. The etch is timed to, undercut, or remove portions of the substrate 12 beneath, or adjacent to, the BOX layer 14 that will become the diffusion regions (source/drain), and leave the substrate 12 beneath, or adjacent to, the BOX layer 14 that will become the channel region of the MOSFET device.

Figure 4B:
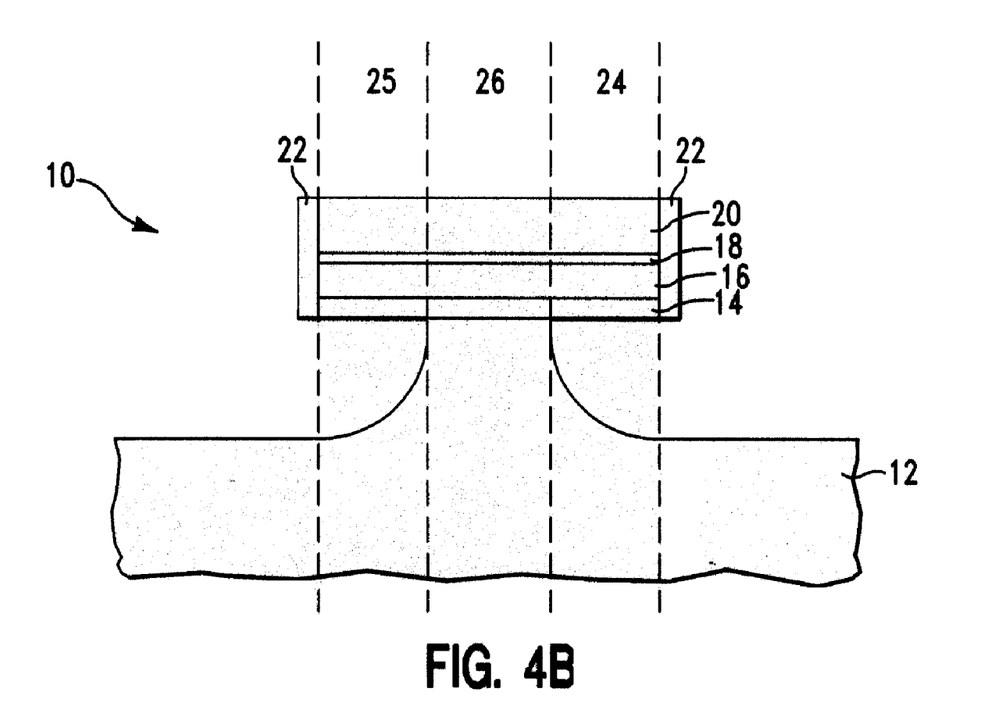
FIG. 4B depicts the device of FIG. 4A having dashed lines indicating first, second and third regions of the device.

FIG. 4B delineates three regions of the device 10, (a first region 24, a second region 25, and a third region 26), using dashed lines, for purposes of illustration and clarification. In particular, FIG. 4B shows that the etch removes the substrate 12 beneath the BOX layer 14 in the first region 24 of the device 10 and the second region 25 of the device, while leaving the substrate 12 in the third region 26 of the device unetched. The device layer 16 in the first and second regions 24, 25 of the device 10 will become the source and drain regions of the MOSFET device 10. The device layer 16 in the third region 26 of the device 10 will become the channel of the MOSFET device 10.

Figure 5A:
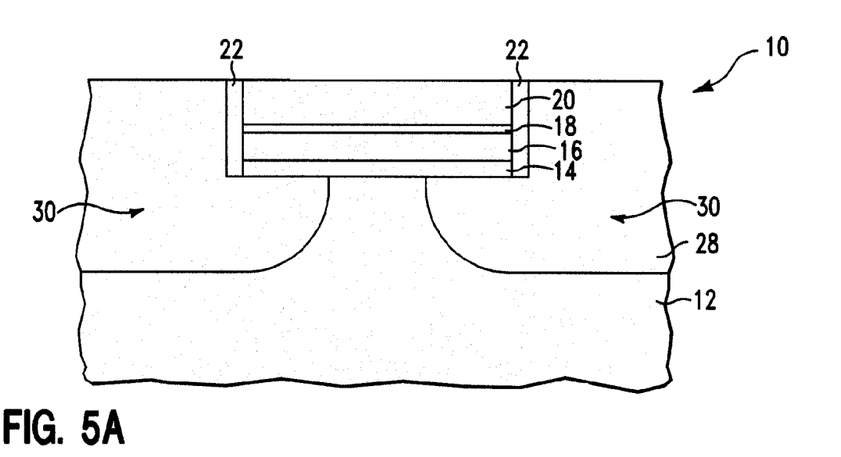
FIG. 5A depicts the device of FIG. 4A following formation of shallow trench isolations.

Following formation of the openings 23 within the substrate 12, a second insulative layer 28 is uniformly deposited over the surface of the device 10 and planarized down to the second protective layer 20, forming isolation regions 30, as illustrated in FIG. 5A. The second insulative layer 28 may comprise an oxide, such as silicon dioxide, CVD-deposited TEOS (triethyloxysilicate), or other similarly used material. The second insulative layer 28 may be deposited using chemical vapor deposition (CVD), or other similarly used deposition technique.

Figure 5B:
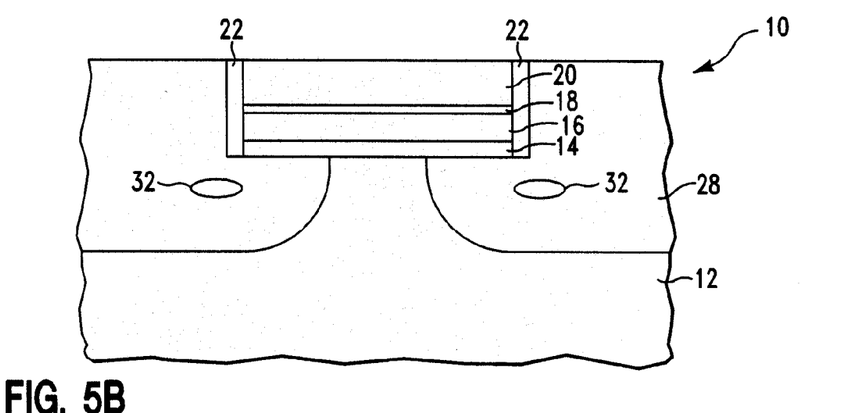
FIG. 5B depicts the device of FIG. 5A having voids formed within the shallow trench isolations.

As illustrated in FIG. 5B, voids 32 may be formed within the second insulative layer 28 during deposition. The voids 32, or regions without the insulative material of the second insulative layer 28, have a low dielectric constant, which further reduces the capacitance between the source/drain regions (formed infra within the first 24 and second 25 regions of the device 10), and the substrate 12.

Figure 6:
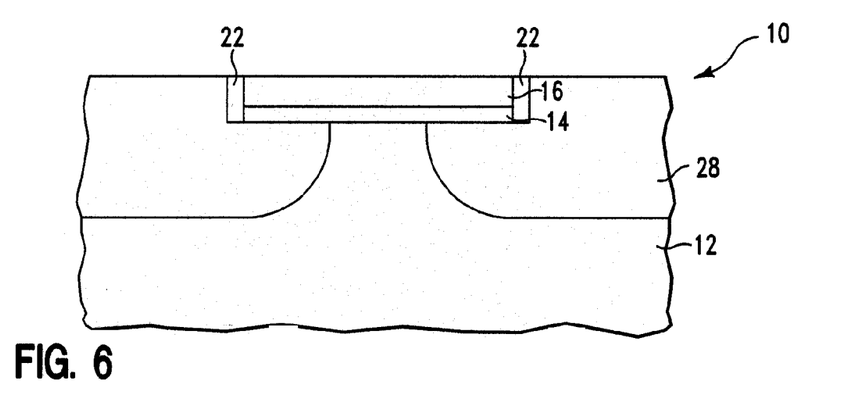
FIG. 6 depicts the device of FIG. 5A following planarization.

As illustrated in FIG. 6, the first and second protective layers 18, 20 are removed to form a substantially planar surface for the formation of the SOI transistor. The second protective layer 20 is etched using a nitride etch process. The first protective layer 18 is then removed using a chemical mechanical polishing process, etch process, or the like. Alternatively, a portion of the first protective layer 18 may be left as a gate oxide during the subsequent gate formation step. Also, optional ion implantations may be used to dope the device layer 16.

Figure 7:
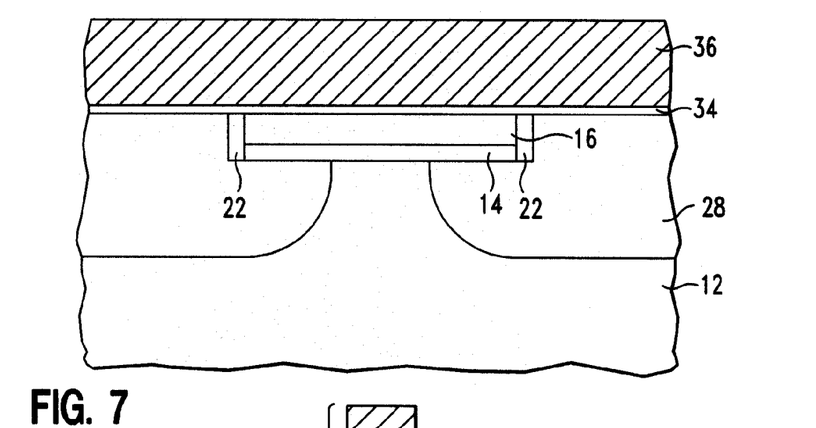
FIG. 7 depicts the device of FIG. 6 having a first insulative layer and a conductive layer formed on the planarized surface of the device.

As illustrated in FIG. 7, a third insulative layer 34 is deposited over the surface of the device 10 having a thickness that is determined by transistor performance specifications. The third insulative layer 34 may comprise an oxide, such as $SiO_2$, silicon-oxynitride, or other similar material, and may be deposited using CVD, or other similarly used deposition technique. A conductive layer 36, comprising a material such as polysilicon, or other similarly used conductive material, is deposited using CVD, or other similarly used deposition technique, having a thickness on the order of about 1000 Å.

Figure 8:
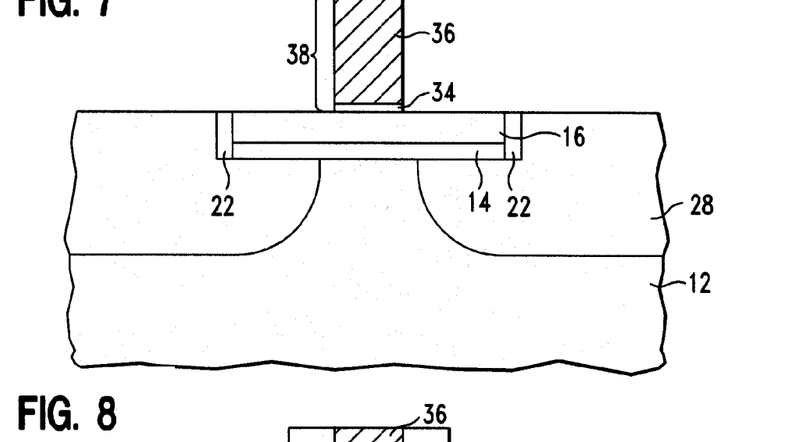
FIG. 8 depicts the device of FIG. 7 following gate formation.
Figure 9:
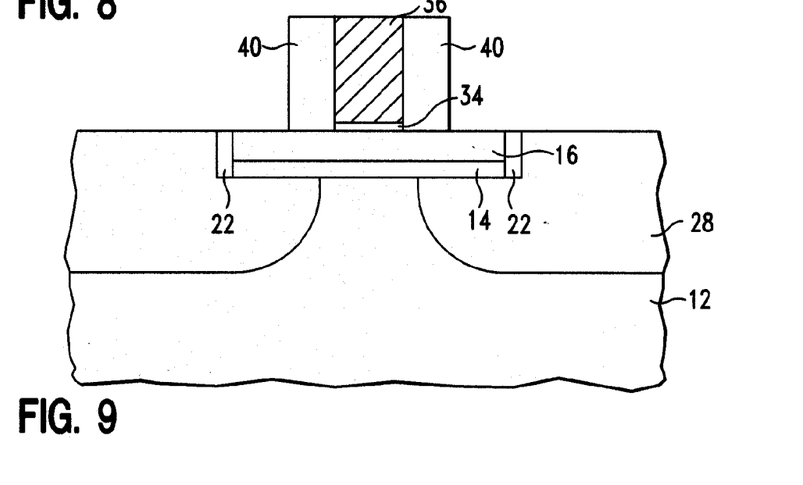
FIG. 9 depicts the device of FIG. 8 following spacer formation.

As illustrated in FIG. 8, the third insulative layer 34 and the conductive layer 36 are patterned and etched, using conventional techniques, to form a gate stack 38. A spacer 40 is then formed around the gate stack 38 by first uniformly depositing a film, such as nitride, over the surface of the device 10, using conventional deposition techniques, followed by an etch, e.g., an anisotropic reactive ion etch, to remove the excess film on the horizontal surfaces of the gate stack 38, leaving the film on the vertical surfaces of the gate stack 38 (refer to FIG. 9).

Figure 10:
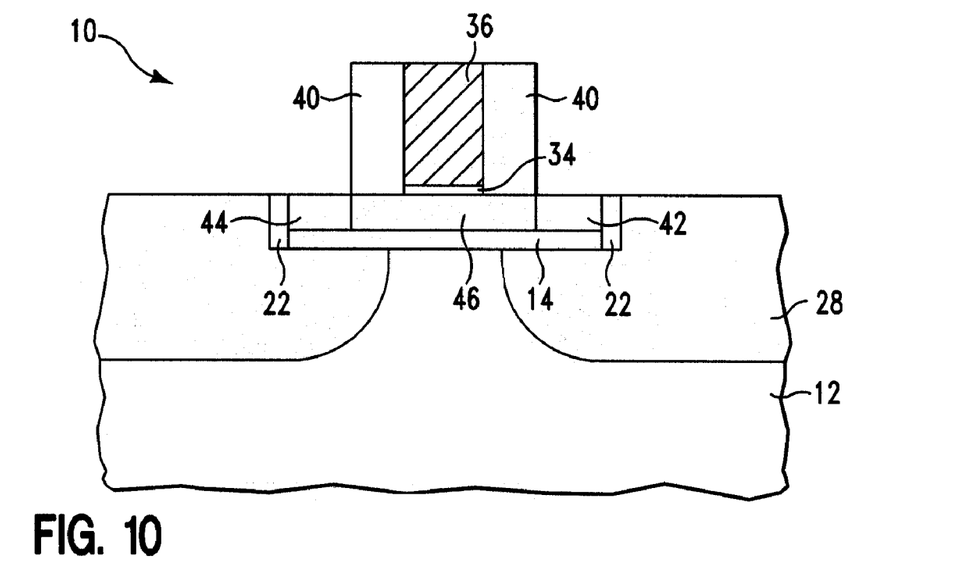
FIG. 10 depicts the device of FIG. 9 following source/drain formation.

As illustrated in FIG. 10, a source region 42 and a drain region 44 are formed within the device layer 16, using dopant implantation techniques known in the art. Also, a channel region 46 is created by the formation of the source 42 and drain 44 regions, as is known in the art. During the formation of the gate stack 38 and source 42 and drain 44 regions ion implantation steps are performed at the appropriate time to form various doped channel regions including, but not limited to, lightly-doped drain (LDD) regions and halo regions, as known in the art.

Figure 11:
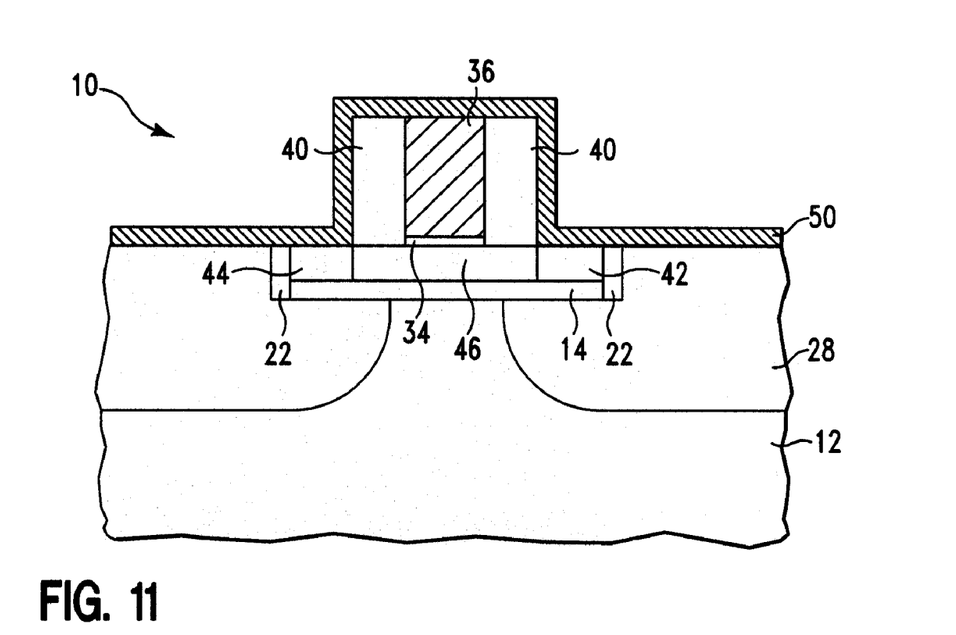
FIG. 11 depicts the device of FIG. 10 having a conductive layer formed thereon.
Figure 12A:
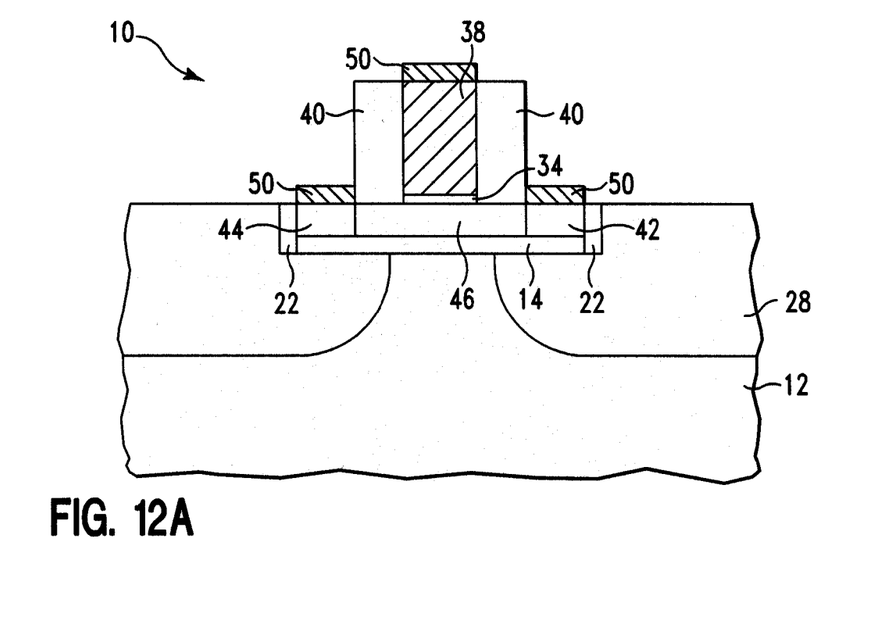
FIG. 12A depicts the device of FIG. 11 following selective etching.

As illustrated in FIG. 11, a conductive layer 50 is deposited over the surface of the device 10 using sputtering, or other similarly used deposition technique. The conductive layer 50 may comprise a metal, such as titanium, cobalt, nickel, etc. A silicon anneal process is performed, as known in the art. Thereafter, the conductive layer 50 is reacted to form metal silicide leaving a silicide layer 51 on the source 42 and drain 44 regions and the gate 38, as illustrated in FIG. 12A. The excess portion of the conductive material 50 is then removed using known techniques.

Figure 12B:
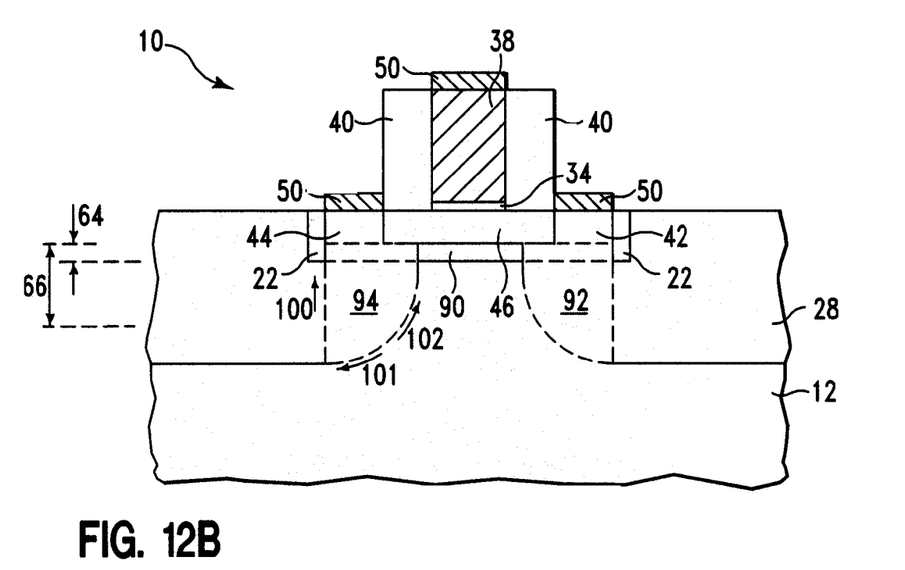
FIG. 12B depicts the device of FIG. 12A having dashed lines to indicate a thin insulator region and thick insulator regions of the device.

As illustrated in FIG. 12B, the device 10 of the present invention has a "thin" insulator region 90, (comprising the BOX layer 14), substantially beneath the channel 46 in the third region 26 of the device 10, (FIG. 4B), and two thick insulator regions 92, 94, (comprising the BOX layer 14 and the insulative layer 28), substantially beneath the source 42 and drain 44 in the first 24 and second 25 regions of the device 10. "Thin" is defined as a thickness in the range of about 10–90 Å, and "thick" is defined as a thickness in the range of about 200–2000 Å. The thin insulator region 90 provides better coupling between the channel region 46 and the substrate 12, thereby possibly allowing some floating body effects yet providing a stabilized, more predictable threshold voltage. The thick insulator regions 92, 94 provide reduced capacitance between the source/drain regions 42, 44 and the substrate 12.

Figure 13:
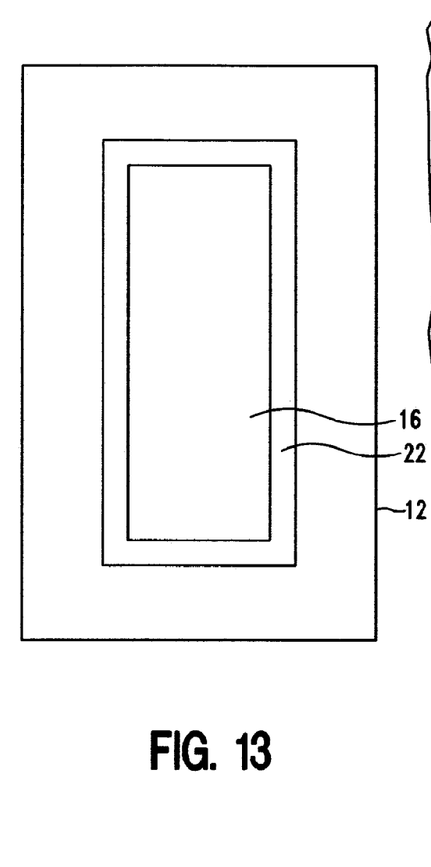
FIG. 13 depicts a top view of the device of FIG. 3 in accordance with a second embodiment of the present invention.
Figure 14:
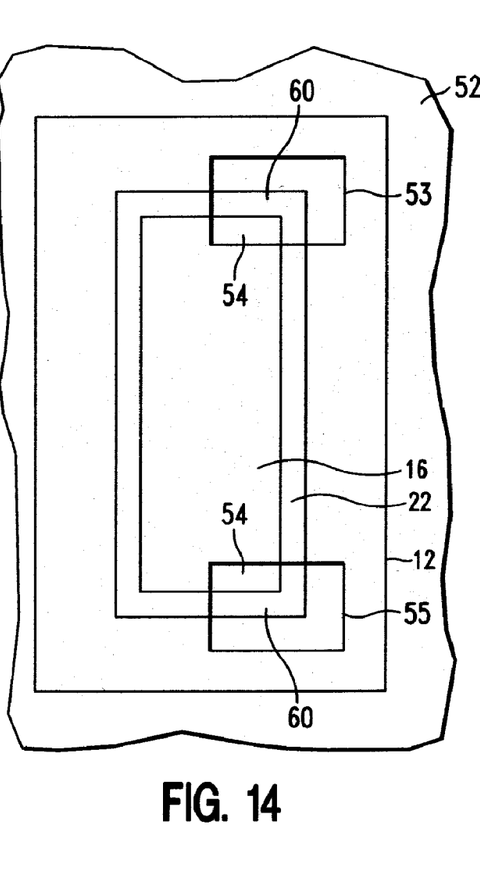
FIG. 14 depicts the device of FIG. 13 having masks thereover.

In accordance with a second embodiment of the present invention, following formation of the spacer 22 (refer to cross-sectional view in FIG. 3, and shown in a top view in FIG. 13), a mask 52 is placed over the device 10, as shown in FIG. 14. The mask 52, in this example having two openings 53, 55, is placed over a portion of the spacer 22 and a portion 54 of the active region 56 (FIG. 2).

A portion of the spacer 22 is then removed, using a selective etching process, such as RIE, etc., within regions 60 defined by the openings 53, 55 of the mask 52. A conductive material 58 is then deposited over the surface of the device 10 filling regions 60 where the spacer 22 was removed. The conductive material 58 may comprise polysilicon, epitaxial silicon, silicon germanium, silicide, etc. The surface of the device 10 is then etched, e.g., using a reactive ion etch process, leaving the conductive material 58 within the regions 60, as illustrated in FIG. 15.

Figure 15:
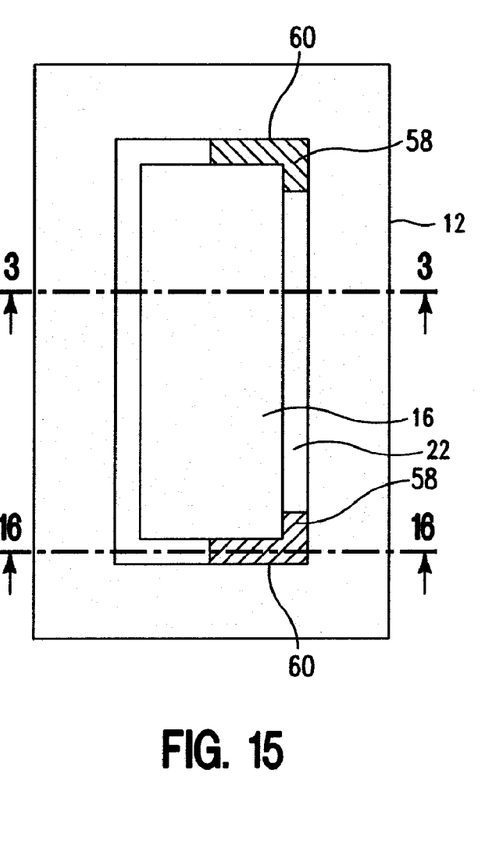
FIG. 15 depicts the device of FIG. 14 having body contacts formed within the device.
Figure 16:
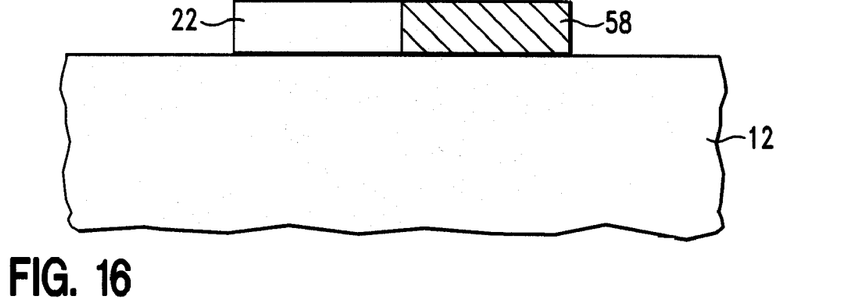
FIG. 16 depicts a cross-sectional view of the device of FIG. 15 along line 16—16.
Figure 17:
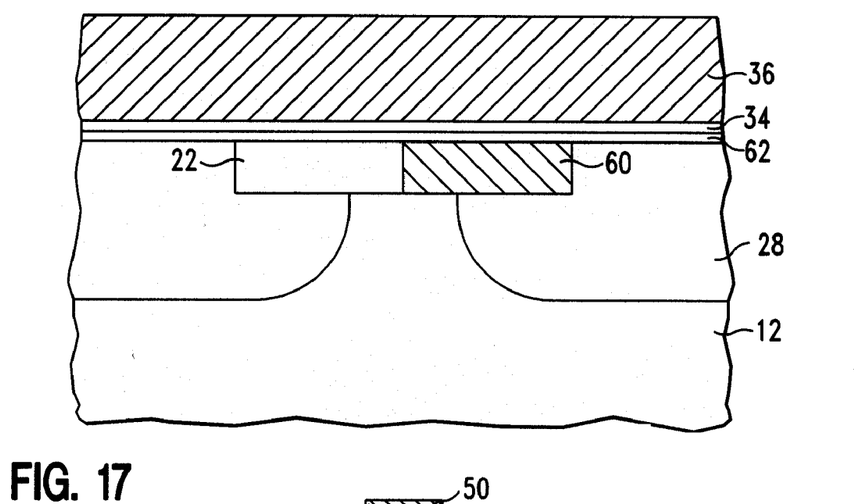
FIG. 17 depicts the device of FIG. 16 having insulative layers and a conductive layer thereon.
Figure 18:
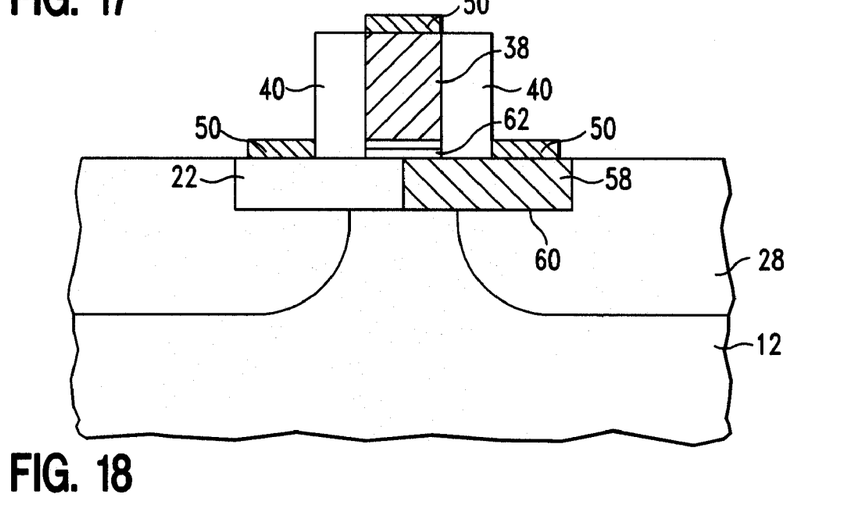
FIG. 18 depicts the device of FIG. 17, along cross-section 16—16, following formation processes similar to that illustrated in FIGS. 4–12A.
Figure 19:
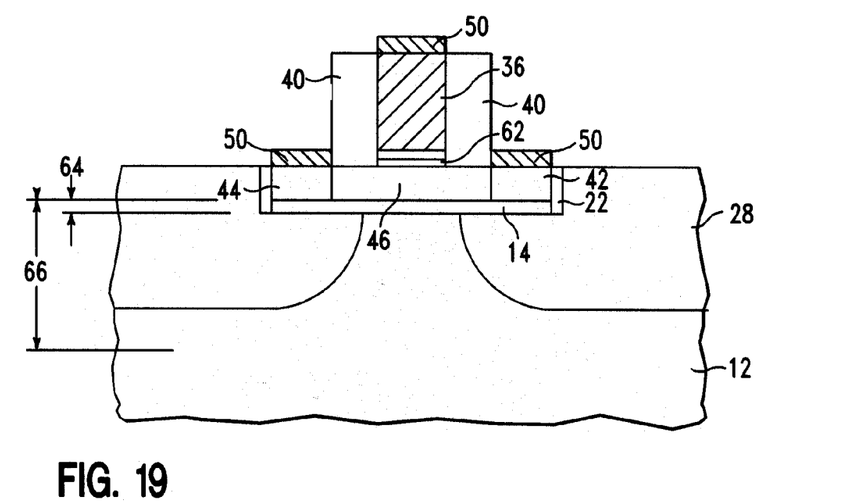
FIG. 19 depicts the device of FIG. 18 along cross-section 3—3.

FIG. 16 depicts the device 10 in cross-sectional view of FIG. 15 along line 16—16. (The cross-sectional view of FIG. 15 along line 3-3 is the same as that of FIG. 3 formed earlier.) An optional insulative layer 62 is deposited over the surface of the device 10 prior to depositing the insulative layer 34 and the conductive layer 36, as illustrated in FIG. 17. The insulative layer 62 prevents the conductive material 58 within regions 60 (FIG. 15) from contacting and electrically shorting the conductive material 36 within the gate 38, as shown in FIG. 18. Following deposition of the insulative layer 62, the formation of the gate 38, the spacer 40, the source 42/drain 44 regions, the channel implants (if needed), the channel region 46 (FIG. 19), the deposition of the conductive material 50 and the formation of silicide 51, remains the same as that described in the first embodiment. Note that the openings 53, 55 within the etch mask 52 used to form the insulative layer 62 (FIG. 18) can be optionally enlarged to further isolate the conductive material 50 from the substrate 12.

The regions 60, filled with conductive material 58, form body contacts 60 that produce an electrical short between the channel 46 and the source 42. This further reduces the amount of floating body effect, or threshold voltage shift, of the channel potential 46, thereby ensuring a relatively stable threshold voltage potential. In addition, the conductive material 58 within the body contacts 60 provides additional contacts on the ends of the device 10 for other uses.

Both embodiments of the present invention provide a device 10 having a thin insulator region 90, (the BOX layer 14), between the channel region 46 and the substrate 12, and thick insulator regions 92, 94, (the combination of both the BOX layer 14 and the insulative material 28), between the source 42/drain 44 regions and the substrate 12. As clearly seen in FIGS. 12B and 19, the thin insulator region 90, located between the channel region 46 and the substrate 12, has a thickness 64 in the range of about 10–90 Å. The thick insulator regions 92, 94, located between the source 42/drain 44 regions and the substrate 12, each have a thickness 66 in the range of about 200–2000 Å. As illustrated, the thickness 66 of the thick insulator regions 92, 94 is greater than the thickness 64 of the thin insulator region 90. It should be noted that the thickness 66 of the thick insulator regions 92, 94 is an average thickness taken in the directions of arrows 100, 101 and 102, (see FIG. 12B), in accordance with a method of calculating averages known to those skilled in the art.

The thick insulator regions 92, 94 in the first 24 and second 25 regions of the device 10 (FIGS. 12B and 4B) optimally decreases capacitance between the source 42/drain 44 regions and the substrate 12. In contrast, the thin insulator region 90 in the third region 26 of the device 10 (FIGS. 12B and 4B) is thin enough to decrease threshold voltage fluctuations through capacitance coupling to the substrate 12.

Figure 20:
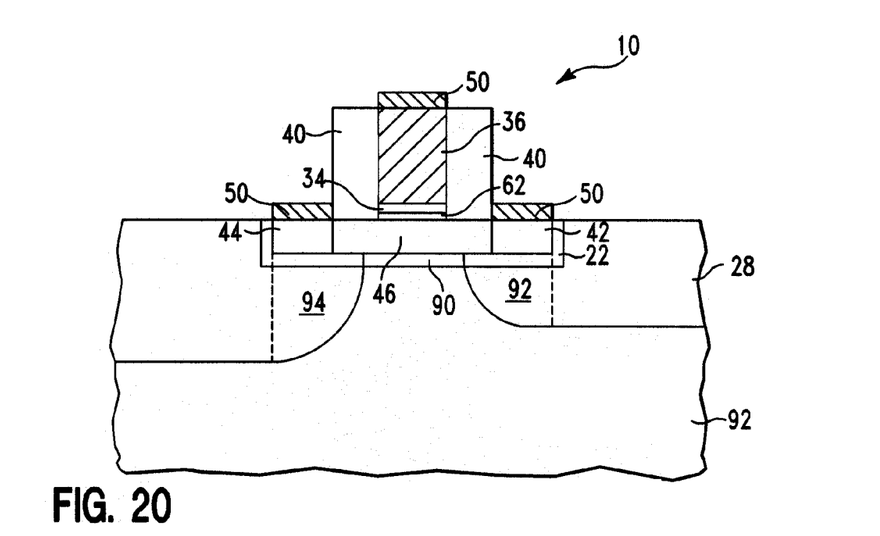
FIG. 20 depicts an alternate embodiment wherein the thick insulator region of the source and drain regions have different thicknesses.

The present invention was described using a device 10 wherein the two thick insulator regions 92 and 94 had approximately the same thickness. It is should be noted that it is possible to form the device 10 wherein the thicknesses of the first and second isolator regions 92, 94 are different. For example, the thickness of the second thick insulator region 94 may be greater than the thickness of the first thick insulator region 92, as depicted in FIG. 20, or vice versa (not shown). As clearly illustrated, however, both the first and second thick insulator regions 92, 94 have a thickness greater than, or equal to, the thickness of the thin insulator region 90.

It should be noted that the present invention was described in conjunction with a MOSFET device, however, the description is not limited as such. The present invention is applicable to many other fields of semiconductor manufacture as would be obvious to those skilled in the art.

What is claimed is:

1. A method of forming a semiconductor device, comprising:
    providing a substrate having a first insulative layer on a surface of the substrate, and a device layer on a surface of the first insulative layer;
    forming an opening within the substrate in direct mechanical contact with the first insulative layer in a first region and a second region of the device, wherein the second region of the device is non-adjacent to the first region, leaving the substrate in direct mechanical contact with the first insulative layer in a third region of the device;
    depositing a second insulative layer over a surface of the device, filling the opening within the substrate in the first and second regions of the device, such that a thickness of the first insulative layer and the second insulative layer within the first and second regions of the device is greater than a thickness of the first insulative layer within the third region of the device;
    planarizing a surface of the device to remove excess insulative material; and
    forming an active region of the device within the device layer wherein the active region of the device comprises a source within the first region of the device, a drain within the second region of the device and a channel within the third region of the device.

2. The method of claim 1, wherein the device comprises a field effect transistor.

3. The method of claim 1, further comprising:
    forming gate over the channel in the third region of the device.

4. The method of claim 1, further comprises:
    depositing an insulative material over a surface of the substrate; and
    etching the insulative material to form a spacer around the first insulative layer and the device layer.

5. The method of claim 4, wherein forming the spacer further comprising:
    removing a portion of the insulative material above the first region of the device and an adjacent portion of the insulative material above the third region of the device;
    depositing a conductive material over a surface of the device; and
    forming the conductive material such that a portion of the spacer in the first region of the device and an adjacent portion of the spacer in the third region of the device are filled with the conductive material.

6. The method of claim 5, wherein following forming the spacer further comprises:
    depositing a third insulative layer over a surface of the device before forming the active region within the device layer.

7. The method of claim 1, wherein the thickness of the first insulative layer and the second insulative layer within the first and second regions of the device is an average thickness calculated within the first and second regions of the device.

8. The method of claim 1, wherein the thickness of the first insulative layer is different than the thickness of the second insulative layer.

9. A method of forming a semiconductor device, comprising:
    providing a substrate having a first insulative layer on a surface of the substrate, and a device layer on a surface of the first insulative layer;
    forming an opening within the substrate that undercuts the first insulative layer in a first region and a second region of the device, leaving the substrate beneath the first insulative layer in a third region of the device, wherein the first insulative layer within the third region forms a thin insulator region;
    depositing a second insulative layer within the opening within the substrate in the first and second regions of the device to form a thick insulator region; and
    forming an active region of the device within the device layer wherein the active region of the device comprises a source within the first region of the device, a drain within the second region of the device and a channel within the third region of the device.

10. The method of claim 9, further comprising forming voids within the second insulative layer.

11. The method of claim 9, wherein the first insulative layer on the surface of the substrate comprises a buried oxide layer.

12. The method of claim 9, further comprising:
    forming gate over the channel in the third region of the device.

13. The method of claim 9, after providing the substrate further comprising:
    patterning the first insulative layer and the device layer forming a location for the formation of the active region;
    etching the first insulative layer and the device layer in the location for the formation of the active region;
    depositing an insulative material over a surface of the substrate; and
    etching the insulative material to form a spacer around the first insulative layer and the device layer.

14. The method of claim 13, further comprising:
removing a portion of the insulative material above the first region of the device and an adjacent portion of the insulative material above the third region of the device;
depositing a conductive material over a surface of the device; and
forming the conductive material such that a portion of the spacer above the first region of the device and an adjacent portion of the spacer above the third region of the device are filled with the conductive material.

* * * * *